(12) United States Patent  (10) Patent No.: US 7,525,840 B2
Rahman et al.  (45) Date of Patent: Apr. 28, 2009

(54) MEMORY ARRAY WITH PSEUDO SINGLE BIT MEMORY CELL AND METHOD

(75) Inventors: Ahsanur Rahman, Folsom, CA (US); Rezaul Haque, Folsom, CA (US); Kerry D. Tedrow, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/834,947

(22) Filed: Aug. 7, 2007

(65) Prior Publication Data

US 2007/0268758 A1  Nov. 22, 2007

Related U.S. Application Data

(62) Division of application No. 11/171,895, filed on Jun. 30, 2005, now Pat. No. 7,272,041.

(51) Int. Cl.
G11C 16/04 (2006.01)
(52) U.S. Cl. .............. 365/185.03; 365/185.33; 365/185.19; 365/185.18
(58) Field of Classification Search ............ 365/185.33, 365/185.03, 185.19, 185.18
See application file for complete search history.

(56) References Cited

U.S. PATENT DOCUMENTS

| 5,339,272 | A | 8/1994 | Tedrow et al. |
| 5,523,972 | A | 6/1996 | Rashid et al. |
| 5,574,879 | A | 11/1996 | Wells et al. |
| 5,973,957 | A | 10/1999 | Tedrow |
| 6,097,637 | A | 8/2000 | Bauer et al. |
| 6,353,553 | B1 | 3/2002 | Tamada et al. |
| 6,535,419 | B2 | 3/2003 | Parker et al. |
| 6,549,457 | B1 | 4/2003 | Srinivasan et al. |
| 6,587,373 | B2 | 7/2003 | Talreja |
| 6,870,767 | B2 | 3/2005 | Rudelic et al. |
| 6,891,764 | B2 | 5/2005 | Li |
| 7,110,292 | B2 | 9/2006 | Hahn et al. |
| 7,272,041 | B2 * | 9/2007 | Rahman et al. ........ 365/185.03 |
| 2005/0180209 | A1 | 8/2005 | Lasser |

* cited by examiner

*Primary Examiner*—Andrew Q Tran
(74) *Attorney, Agent, or Firm*—Marshall, Gerstein & Borun LLP

(57) ABSTRACT

In the multi level/bit per cell memory array, a flag cell indicates pseudo single bit per cell configuration for one or more cells of the memory array. The output of the cell or cells associated with the flag cell is a single bit when the flag cell is set. The cell or cells associated with the flag cell operate as multi level/bit per cell cells when the flag cell is not set. The flag cell of the memory array may also be a multi level/bit per cell cell that is read to provide a single bit output. Multiple flag cells may be provided and associated with various cells or groups of cells so that these cells or groups of cells may be operated in a user selectable pseudo single bit configuration.

4 Claims, 2 Drawing Sheets

MEMORY ARRAY WITH PSEUDO SINGLE BIT MEMORY CELL AND METHOD

CROSS REFERENCE

This application is a divisional of U.S. application Ser. No. 11/171,895, filed Jun. 30, 2005, the disclosure of which is hereby incorporated herein by reference in its entirety for all purposes.

TECHNICAL FIELD

This patent relates to memory devices, and more particularly, this patent relates to providing a pseudo single bit cell (PSBC) in a multi bit per cell (MLC) memory device.

BACKGROUND

A multi bit/level per cell memory includes multi level cells, each of which is able to store multiple charge states or levels. Each charge state is associated with a memory element bit pattern. A multi bit/level per cell memory is able to store more than one bit of data per cell based on the number of charge states for the cell. For example, a four charge state per cell multi bit/level per cell can store two bits of data per cell. Generally speaking, the number of charge states required to store "n" bits of data is $2^n$. However, the number of charge states storable in a multi bit/level per cell is not limited to powers of two, and a memory cell with three charge states is operable to store 1.5 bits of data, for example.

A flash EEPROM memory cell, as well as many other types of memory cells, may be configurable to store multiple bits per cell by maintaining multiple threshold voltage levels (Vt) at each cell. In a memory cell capable of storing two bits per cell, for example, four threshold voltage levels (Vt) are used. Consequently, two bits are designated for each threshold level. In one implementation, the multi level cell may store four charge states with level three having a higher charge than level two, level two a higher charge than level one and level one a higher charge than level zero. A reference voltage may separate the various charge states. For example, a first voltage reference may separate level three from level two, a second voltage reference may separate level two from level one and a third voltage reference may separate level one from level zero.

With greater numbers of bits per cell, there is a greater possibility of read errors. Thus, a four bit multi bit/level per cell is more likely to experience read errors than a one bit cell. The potential for read errors is inherent in the small differential voltages used to store adjacent states. If the stored data is potentially lossy, sensitive data stored in relatively high-density multi bit/level per cell devices may be subject to increased error rates.

DETAILED DESCRIPTION

Fidelity is enhanced in a multi level/bit per cell memory array by providing pseudo single bit operation for a cell, sub-block of cells, block of cells or the entire memory array. In a multi level/bit per cell memory array, a flag cell indicates pseudo single bit per cell configuration for one or more cells of the memory array. The output of the cell or cells associated with the flag cell is a single bit when the flag cell is set. The cell or cells associated with the flag cell operate as multi level/bit per cell cells when the flag cell is not set. The flag cell of the memory array may also be a multi level/bit per cell cell that is read to provide a single bit output. Multiple flag cells may be provided and associated with various cells or groups of cells so that these cells or groups of cells may be operated in a user selectable pseudo single bit configuration.

Figure 1:
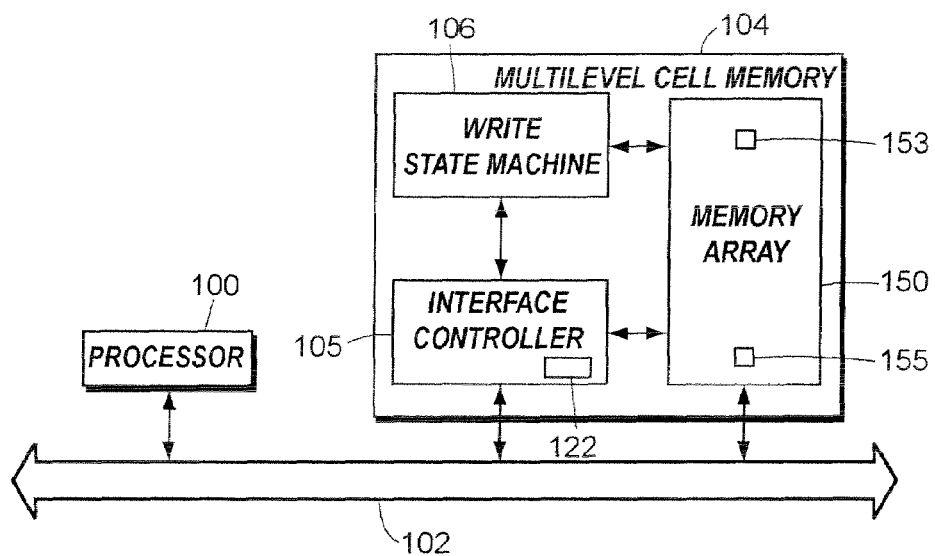
FIG. 1 is a block diagram of a memory structure in accordance with a described embodiment.

Referring to FIG. 1, a processor 100 may be coupled through a bus 102 to a multi level cell memory 104. The memory 104 contains an interface controller 105, a write state machine 106 and a multi level/bit per cell (MLC) memory array 150 including at least one memory cell 153 that may be configured as a multi level memory cell or as a pseudo single bit per cell memory cell 153. The processor 100 is coupled by the bus 102 to both the interface controller 105 and the memory array 150 as shown, although alternative architectures are possible. The memory array 150 includes at least one pseudo single bit per cell (PSBC) flag cell 155. The interface controller 105 provides control over the memory array 150. The write state machine 106 communicates with the interface controller 105 and the memory array 150. The interface controller 105 passes data to be written into or read from the memory array 150 to the state machine 106. The state machine 106 executes a sequence of events to write data into or read data from the memory array 150, including the flag cell 155. In one embodiment, the interface controller 105, the write state machine 106 and the memory array 150 are located on a single integrated circuit die.

Although embodiments are described in conjunction with the memory array 150 storing one, two or four bits per cell, any number of bits may be stored in a single cell, for example, by increasing the number of threshold levels. Providing the memory array 150 is a multi level/bit per cell array, the number of levels per cell is not critical to implementation of the described embodiments. Furthermore, although embodiments are described in conjunction with a memory array 150 of flash cells, other cells such as read only memory (ROM), erasable programmable read only memory (EPROM), conventional electrically erasable programmable read only memory (EEPROM), or dynamic random access memory (DRAM), to mention a few examples, may be substituted.

A single cell, e.g. cell 153, a portion of the memory array 150 or the entire memory array 150 may be user configurable to operate in a pseudo single bit per cell manner based upon the status of an associated flag cell. In this regard, the user may specify that a single cell, a sub-block or sub-blocks of cells, blocks or other subdivisions of cells of the array may be operated in pseudo single bit operation. The user may further specify that a cell specified in single bit operation may be later be used as a multi bit cell. When a cell is configured for pseudo single bit operation the result of a cell read operation is that the cell returns one bit of data.

The following description refers to a two bit per cell flash memory architecture with step up threshold voltage (Vt) sensing. A pseudo single bit per cell flag specific cell is programmed to indicate pseudo single bit per cell operation. Notwithstanding, it is possible to implement pseudo single bit per cell operation in step down Vt sensing architectures, or to implement pseudo single bit per cell in architectures using other sensing schemes. For example, pseudo single bit per cell operation may be implemented in virtually any memory architecture where digital quantization is used to convert sense bus status into digital data.

Figure 2:
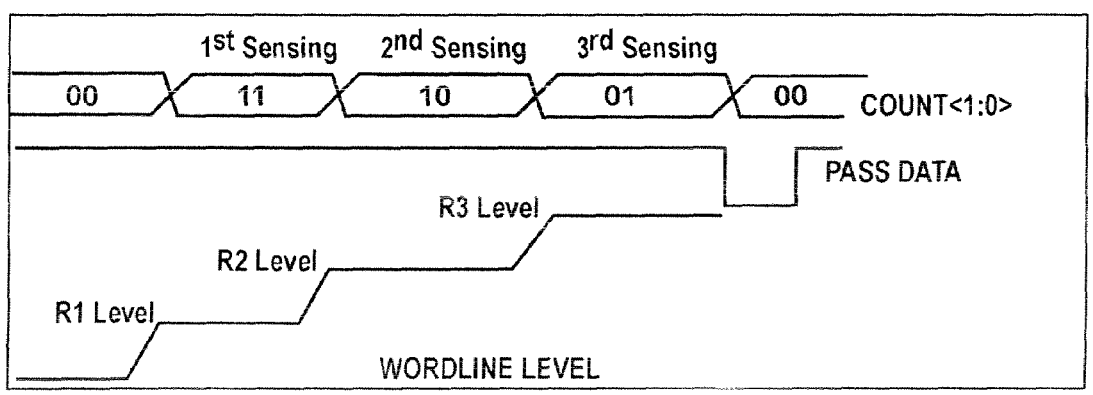
FIG. 2 is a timing diagram graphically illustrating voltage threshold sensing for a two bits per cell step up sensing Flash cell.

As is well known for a step up Vt sensing architecture, the sensing bus trips whenever the cell Vt is less than the wordline voltage of the cell, e.g., R1 Level, R2 Level, R3 Level shown in FIG. 2. For a two bits per cell memory structure, step up Vt sensing requires three sensing steps, 1st Sensing, 2nd Sensing and 3rd Sensing, to resolve the cell status. The wordline voltage level steps up with every sensing step causing the sense bus to trip if the Vt of the cell is less than any of the other three word line voltage levels. Post sensing, the cell data is resolved using a count signal, Count, synchronized with the sensing event. If the sense bus trips at the first sensing, post sensing Count will latch the cell status as "11"; if the sense bus trips at the second sensing, post sensing Count will latch the cell status as "10", if the sense bus trips at the third sensing, post sensing Count will latch the cell status as "01"; and if the sense bus does not trip during any of the three sensing steps, then the cell Vt is higher than all of the wordline voltage levels and post sensing Count will latch the cell status as "00". The pass data signal allows the post sense data, i.e., the latched status of the cell, to propagate outside the flash cell, and hence from the memory array.

In pseudo single bit per cell configuration, the cell outputs a single bit per cell. To establish the pseudo single bit per cell configuration, a specific cell of the memory array called the pseudo single bit per cell flag cell 155 is programmed to indicate pseudo single bit per cell operation. The flag cell 155 may be associated with a single cell, a sub-block or block of cells, or for the entire memory array. Multiple flag cells may be provided associated with different cells or groups of cells of the memory array. The flag cell 155 is sensed first to determine pseudo single bit per cell configuration. When pseudo single bit per cell configuration is established, the Count is overwritten to indicate only a "1" or "0", i.e., single bit, output from the cell. The Count is overwritten for the particular cell or cells associated with the flag cell, as the case may be.

The flag cell status may be determined against the R2 wordline Level, that is, pseudo single bit per cell configuration may be indicated if the flag cell sense bus has not tripped following the 2nd Sensing. If the flag cell sense bus does trip at the 1st Sensing or the 2nd Sensing, then two bit MLC operation is indicated. Determination of the flag cell is illustrated by the timing diagram of FIG. 3. Of course the flag cell status may be indicated at any wordline level (R1, R2 or R3).

Figure 3:
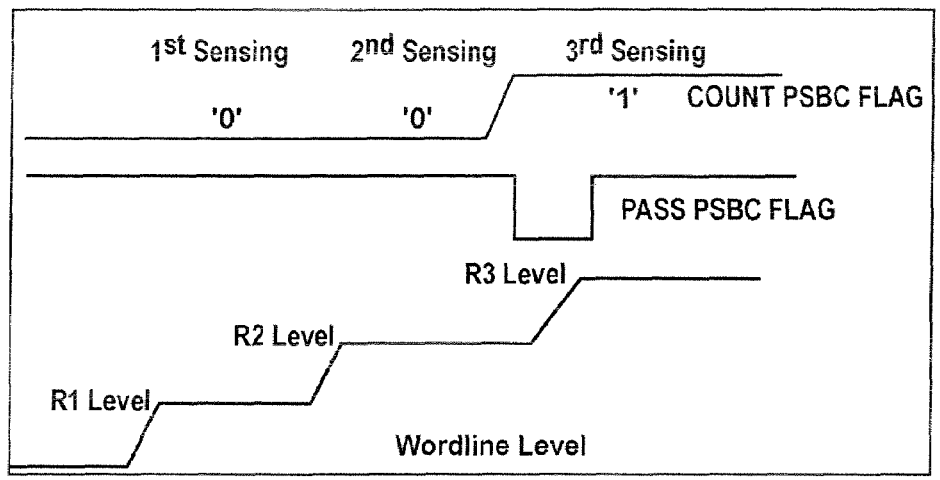
FIG. 3 is a timing diagram graphically illustrating voltage threshold sensing for pseudo single bit per cell Flag cell.

As shown in FIG. 3, a CountPSBCFlag is "0" for either the 1st Sensing or the 2nd Sensing. If the sensing bus trips at either the 1st Sensing or the 2nd Sensing, then CountPSBC-Flag value remains "0", and the flag cell status will be "0" indicating multi level/bit per cell operation. If the sensing bus does not trip at the 2nd Sensing, then pseudo single bit operation is indicated, the CountPSBCFlag is "1" resulting in the flag cell status being "1". The PASS PBSC FLAG signal propagates the flag cell status from the flag cell after the 2nd Sensing.

Figure 4:
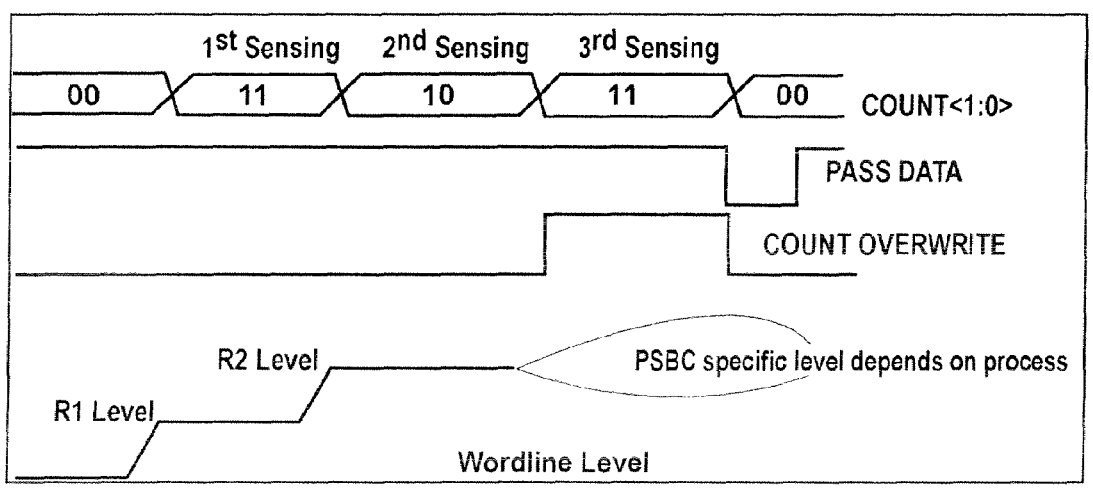
FIG. 4 is a timing diagram graphically illustrating voltage threshold sensing for pseudo single bit per cell operation of a two bits per cell step up sensing Flash cell.

When pseudo single bit per cell configuration and operation is indicated by the flag cell 155, the cell or cells associated with the flag cell 155 output only a single bit. This is illustrated by the timing diagram and cell operation of FIG. 4. R3 wordline Level at the 3rd Sensing is changed to a specific wordline voltage other than the R3 wordline Level, and Cell Vt is compared against the specific wordline voltage. The outcome of the 3rd Sensing is the cell data, "1" if the sensing bus trips at the 3rd Sensing or "0" if the sensing bus does not trip.

Single bit output is provided by overwriting the multi bit Count signal That is, in pseudo single bit per cell configuration, the multi bit Count signal is overwritten to "11" instead of "01". The 1st Sensing and the 2nd Sensing are completed as done for two bit per cell configuration. In the 3rd Sensing, the cell Vt is compared to the pseudo single bit per cell specific R3 wordline level. If the sensing bus tripped during either the 1st or 2nd Sensing, it is first pulled high. Then, if the sensing bus trips in the 3rd Sensing (cell Vt<PSBC specific R3 wordline level), the post sensing will latch the multi bit Count signal as "10", which is overwritten to "11", as described above. This corresponds to a cell output of "1". If the sense bus does not trip in the 3rd Sensing, then the post sensing will latch the Count signal "00", which corresponds to a cell output of "0". That is, cell output is indicated by "11" or "00" where either the most significant bit or the least significant bit is ignored.

Any of the processor 150, the interface controller 105 and/or the write state machine 106 may implement a method of reading a memory cell, as herein described. A method of reading a memory cell may include reading a flag cell, where the flag cell may be settable between a multi bit per cell position and a single bit per cell position. After reading the flag cell, a memory cell associated with the flag cell may be read to provide an output. The output may be a multi bit output when the flag cell is in the multi bit per cell position and a single bit output when the flag cell is in the single bit per cell position. The method may involve reading the single bit output specific voltage threshold of the memory cell when the flag cell is in the single bit per cell position, and providing an output may involve using a count mask to overwrite a multi bit output to provide a single bit output when the flag cell is in the single bit per cell position. When the memory includes a plurality of memory cells, the method may include reading a plurality of memory cells associated with the flag cell and providing an output corresponding to each memory cell of the plurality of memory cells as a multi bit output when the flag cell is in the multi bit per cell position and a single bit output when the flag cell is in the single bit per cell position. The method may also provide for reading a second flag cell. The second flag cell may be settable between a multi bit per cell position and a single bit per cell position. In such a case, the memory may provide for reading a second memory cell associated with the second flag cell and providing a second output. The second output may be a multi bit output when the second flag cell is in the multi bit per cell position and a single bit output when the second flag cell is in the single bit per cell position.

The foregoing method may be implemented as a control program stored in a memory or suitable tangible media associated with the processor 100, the interface controller 105 and/or the write state machine 106; such memory associated with an operable device or function being well known to the person having ordinary skill in the art. Thus, the control program is associated with a controller, e.g., the processor 100, the interface controller 105 and/or the write state machine 106, associated with a memory device to be read. The control program may provide instructions for causing the controller to read a memory cell of the memory device. The control program may be embodied in routines, wherein, for example, a first routine may provide for reading a flag cell where the flag cell may be settable between a multi bit per cell position and a single bit per cell position. A second routine may provide for reading a memory cell associated with the flag cell. And, a third routine may provide for providing an output, where the output may be a multi bit output when the flag cell is in the multi bit per cell position and a single bit output when the flag cell is in the single bit per cell position. The routine for reading a memory cell may provide for reading a single bit output specific voltage threshold of the memory cell when the flag cell is in the single bit per cell position. The routine providing an output may provide for using a count mask to overwrite a multi bit output to provide a single bit output when the flag cell is in the single bit per cell position. The control program may further include additional routines, such as, for example, a fourth routine that provides for reading a second flag cell, where the second flag cell being settable between a multi bit per cell position and a single bit per cell position. A fifth routine may provide for reading a second memory cell associated with the second flag cell. And, a sixth routine may provide for providing a second output, the second output being a multi bit output when the second flag cell is in the multi bit per cell position and a single bit output when the second flag cell is in the single bit per cell position.

While the present disclosure is susceptible to various modifications and alternative forms, certain embodiments are shown by way of example in the drawings and the herein described embodiments. It will be understood, however, that this disclosure is not intended to limit the invention to the particular forms described, but to the contrary, the invention is intended to cover all modifications, alternatives, and equivalents defined by the appended claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader and it is not intended that such claim term by limited, by implication or otherwise, to that single meaning. Unless a claim element is defined by reciting the word "means" and a function without the recital of any structure, it is not intended that the scope of any claim element be interpreted based on the application of 35 U.S.C. §112, sixth paragraph.

We claim:

1. A method of reading a first memory cell, the method comprising:
   reading a flag cell that is associated with the first memory cell, the flag cell being settable between a multi bit per cell position and a single bit per cell position; and
   reading the first memory cell and providing an output, the output being a multi bit output when the flag cell is in the multi bit per cell position and a pseudo single bit output when the flag cell is in the single bit per cell position, the pseudo single bit output being the multi bit output masked to represent a single bit.

2. The method of claim 1, wherein the step of reading the first memory cell comprises reading a single bit output specific voltage threshold of the first memory cell when the flag cell is in the single bit per cell position.

3. The method of claim 1, wherein a plurality of memory cells are associated with the flag cell, and wherein the step of reading the first memory cell and providing an output comprises reading the plurality of memory cells and providing an output corresponding to each memory cell of the plurality of memory cells as the multi bit output when the flag cell is in the multi bit per cell position and the single bit output when the flag cell is in the single bit per cell position.

4. The method of claim 1, further comprising the steps of
   reading a second flag cell that is associated with a second memory cell, the second flag cell being settable between the multi bit per cell position and the single bit per cell position;
   reading the second memory cell and providing a second output, the second output being the multi bit output when the second flag cell is in the multi bit per cell position and the single bit output when the second flag cell is in the single bit per cell position.

* * * * *